(12) United States Patent
Yuan et al.

(10) Patent No.: US 7,674,727 B2
(45) Date of Patent: *Mar. 9, 2010

(54) NITROUS OXIDE ANNEAL OF TEOS/OZONE CVD FOR IMPROVED GAPFILL

(75) Inventors: Zheng Yuan, Fremont, CA (US); Reza Arghavani, Scotts Valley, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

This patent is subject to a terminal disclaimer.

(21) Appl. No.: 11/549,919

(22) Filed: Oct. 16, 2006

(65) Prior Publication Data

US 2007/0059896 A1 Mar. 15, 2007

Related U.S. Application Data

(63) Continuation of application No. 10/757,771, filed on Jan. 14, 2004, now Pat. No. 7,141,483, which is a continuation-in-part of application No. 10/247,672, filed on Sep. 19, 2002, now Pat. No. 6,905,940.

(51) Int. Cl.
*H01L 21/31* (2006.01)
(52) U.S. Cl. .............................. 438/787; 257/E21.278; 257/E21.279
(58) Field of Classification Search ......... 438/435–438, 438/787–790; 257/E21.278, E21.279
See application file for complete search history.

(56) References Cited

U.S. PATENT DOCUMENTS

| | | | |
|---|---|---|---|
| 2,861,009 A | 11/1958 | Rubner | |
| 2,889,704 A | 8/1959 | Pekarek | |
| 3,046,177 A | 7/1962 | Hankins | |
| 3,048,888 A | 8/1962 | Shockley et al. | |
| 3,109,703 A | 11/1963 | Politzer et al. | |
| 3,142,714 A | 7/1964 | Politzer et al. | |
| 3,166,454 A | 1/1965 | Voelker | |

(Continued)

FOREIGN PATENT DOCUMENTS

CA 479107 12/1951

(Continued)

OTHER PUBLICATIONS

Applied Materials Website Printout: "SACVD (Sub-Atmospheric Chemical Vapor Deposition)" from www.appliedmaterials.com/products/sacvd.html, printed Jun. 20, 2003.

(Continued)

*Primary Examiner*—Hsien-ming Lee
(74) *Attorney, Agent, or Firm*—Townsend and Townsend and Crew, LLP

(57) ABSTRACT

A method of filling a gap defined by adjacent raised features on a substrate includes providing a flow of a silicon-containing processing gas to a chamber housing the substrate and providing a flow of an oxidizing gas to the chamber. The method also includes varying over time a ratio of the (silicon-containing processing gas):(oxidizing gas). The method also includes exposing the substrate to nitrous oxide at a temperature less than about 900° C. to anneal the deposited film.

5 Claims, 6 Drawing Sheets

U.S. PATENT DOCUMENTS

| | | |
|---|---|---|
| 4,297,162 A | 10/1981 | Mundt et al. |
| 4,590,042 A | 5/1986 | Drage |
| 4,732,761 A | 3/1988 | Machida et al. |
| 4,792,378 A | 12/1988 | Rose et al. |
| 4,854,263 A | 8/1989 | Chang et al. |
| 4,892,753 A | 1/1990 | Wang et al. |
| 4,962,063 A | 10/1990 | Maydan et al. |
| 4,989,541 A | 2/1991 | Mikoshiba et al. |
| 5,051,380 A | 9/1991 | Maeda et al. |
| 5,089,442 A | 2/1992 | Olmer |
| 5,124,014 A | 6/1992 | Foo et al. |
| 5,204,288 A | 4/1993 | Marks et al. |
| 5,244,841 A | 9/1993 | Marks et al. |
| 5,264,040 A | 11/1993 | Geyling et al. |
| 5,314,845 A | 5/1994 | Lee et al. |
| 5,356,722 A * | 10/1994 | Nguyen et al. ............... 427/569 |
| 5,439,524 A | 8/1995 | Cain et al. |
| 5,474,955 A | 12/1995 | Thakur |
| 5,492,858 A | 2/1996 | Bose et al. |
| 5,567,267 A | 10/1996 | Kazama et al. |
| 5,589,002 A | 12/1996 | Su |
| 5,597,439 A | 1/1997 | Salzman |
| 5,660,472 A | 8/1997 | Peuse et al. |
| 5,710,079 A | 1/1998 | Sukharev |
| 5,728,223 A | 3/1998 | Murakami et al. |
| 5,728,260 A | 3/1998 | Brown et al. |
| 5,789,322 A | 8/1998 | Brown et al. |
| 5,807,785 A | 9/1998 | Ravi |
| 5,812,403 A | 9/1998 | Fong et al. |
| 5,840,631 A | 11/1998 | Kubo et al. |
| 5,939,763 A | 8/1999 | Hao et al. |
| 5,965,203 A | 10/1999 | Gabric et al. |
| 5,976,261 A | 11/1999 | Moslehi et al. |
| 5,980,686 A | 11/1999 | Goto |
| 6,001,175 A | 12/1999 | Maruyama et al. |
| 6,013,584 A | 1/2000 | M'Saad |
| 6,024,799 A | 2/2000 | Chen et al. |
| 6,030,460 A | 2/2000 | Sukharev |
| 6,043,136 A | 3/2000 | Jang et al. |
| 6,050,506 A | 4/2000 | Guo et al. |
| 6,079,353 A | 6/2000 | Leksell et al. |
| 6,079,356 A | 6/2000 | Umotoy et al. |
| 6,099,647 A | 8/2000 | Yieh et al. |
| 6,106,663 A | 8/2000 | Kuthi et al. |
| 6,106,678 A | 8/2000 | Shufflebotham et al. |
| 6,133,160 A | 10/2000 | Komiyama et al. |
| 6,136,685 A | 10/2000 | Narwankar et al. |
| 6,140,242 A | 10/2000 | Oh et al. |
| 6,149,987 A | 11/2000 | Perng et al. |
| 6,150,209 A | 11/2000 | Sun et al. |
| 6,150,286 A | 11/2000 | Sun et al. |
| 6,156,114 A | 12/2000 | Bell et al. |
| 6,171,901 B1 | 1/2001 | Blair et al. |
| 6,180,490 B1 | 1/2001 | Vassiliev et al. |
| 6,184,155 B1 | 2/2001 | Yu et al. |
| 6,190,973 B1 | 2/2001 | Berg et al. |
| 6,194,038 B1 | 2/2001 | Rossman |
| 6,197,705 B1 | 3/2001 | Vassiliev |
| 6,203,863 B1 | 3/2001 | Liu et al. |
| 6,206,972 B1 | 3/2001 | Dunham |
| 6,217,658 B1 | 4/2001 | Orczyk et al. |
| 6,218,268 B1 | 4/2001 | Xia et al. |
| 6,232,580 B1 | 5/2001 | Sandhu |
| 6,236,105 B1 | 5/2001 | Kariya |
| 6,239,002 B1 * | 5/2001 | Jang et al. .................. 438/435 |
| 6,239,044 B1 | 5/2001 | Kashiwagi et al. |
| 6,245,192 B1 | 6/2001 | Lenz et al. |
| 6,245,689 B1 | 6/2001 | Hao et al. |
| 6,248,397 B1 | 6/2001 | Ye |
| 6,248,628 B1 | 6/2001 | Halliyal et al. |
| 6,267,074 B1 | 7/2001 | Okumura |
| 6,276,072 B1 | 8/2001 | Morad et al. |
| 6,302,965 B1 | 10/2001 | Umotoy et al. |
| 6,319,849 B1 | 11/2001 | Oda et al. |
| 6,331,494 B1 | 12/2001 | Olson et al. |
| 6,337,256 B1 | 1/2002 | Shim |
| 6,340,435 B1 | 1/2002 | Bjorkman et al. |
| 6,348,421 B1 | 2/2002 | Shu et al. |
| 6,436,193 B1 | 8/2002 | Kasai et al. |
| 6,444,039 B1 | 9/2002 | Nguyen et al. |
| 6,454,860 B2 | 9/2002 | Metzner et al. |
| 6,468,853 B1 | 10/2002 | Balasubramanian et al. |
| 6,475,284 B1 | 11/2002 | Moore et al. |
| 6,479,405 B2 | 11/2002 | Lee et al. |
| 6,489,254 B1 | 12/2002 | Kelkar et al. |
| 6,500,771 B1 | 12/2002 | Vassiliev et al. |
| 6,512,264 B1 | 1/2003 | Ogle, Jr. et al. |
| 6,527,910 B2 | 3/2003 | Rossman |
| 6,541,367 B1 | 4/2003 | Mandal |
| 6,541,401 B1 | 4/2003 | Herner et al. |
| 6,565,661 B1 | 5/2003 | Nguyen et al. |
| 6,583,069 B1 | 6/2003 | Vassilev et al. |
| 6,586,886 B1 | 7/2003 | Katz et al. |
| 6,602,792 B2 | 8/2003 | Hsu |
| 6,617,259 B2 | 9/2003 | Jung et al. |
| 6,624,091 B2 | 9/2003 | Yuan |
| 6,677,712 B2 | 1/2004 | Katz et al. |
| 6,713,127 B2 | 3/2004 | Subramony et al. |
| 6,733,955 B1 | 5/2004 | Geiger et al. |
| 6,734,115 B2 | 5/2004 | Cheung et al. |
| 6,740,601 B2 | 5/2004 | Tan et al. |
| 6,793,733 B2 | 9/2004 | Janakiraman et al. |
| 6,830,624 B2 | 12/2004 | Janakiraman et al. |
| 6,875,558 B1 | 4/2005 | Gaillard et al. |
| 6,905,940 B2 | 6/2005 | Ingle et al. |
| 6,943,091 B2 | 9/2005 | Yu et al. |
| 6,946,358 B2 | 9/2005 | Doris et al. |
| 6,949,447 B2 | 9/2005 | Ahn et al. |
| 7,037,859 B2 | 5/2006 | Ingle et al. |
| 7,141,483 B2 | 11/2006 | Yuan et al. |
| 7,208,425 B2 | 4/2007 | Ingle et al. |
| 7,335,609 B2 | 2/2008 | Ingle et al. |
| 2001/0019860 A1 | 9/2001 | Adachi et al. |
| 2002/0000195 A1 | 1/2002 | Bang et al. |
| 2002/0000196 A1 | 1/2002 | Park |
| 2002/0004282 A1 | 1/2002 | Hong |
| 2002/0006729 A1 * | 1/2002 | Geiger et al. ............... 438/698 |
| 2002/0007790 A1 | 1/2002 | Park |
| 2002/0011215 A1 | 1/2002 | Tel et al. |
| 2002/0050605 A1 | 5/2002 | Jenq |
| 2002/0052128 A1 | 5/2002 | Yu et al. |
| 2002/0102358 A1 | 8/2002 | Das et al. |
| 2002/0163028 A1 | 11/2002 | Yuan |
| 2002/0168840 A1 | 11/2002 | Hong et al. |
| 2002/0192370 A1 | 12/2002 | Metzner et al. |
| 2003/0019428 A1 | 1/2003 | Ku et al. |
| 2003/0022523 A1 | 1/2003 | Irino et al. |
| 2003/0054670 A1 | 3/2003 | Wang et al. |
| 2003/0057432 A1 | 3/2003 | Gardner et al. |
| 2003/0071304 A1 | 4/2003 | Ogle, Jr. et al. |
| 2003/0073290 A1 | 4/2003 | Ramkumar et al. |
| 2003/0089314 A1 | 5/2003 | Matsuki et al. |
| 2003/0104677 A1 | 6/2003 | Park et al. |
| 2003/0107079 A1 | 6/2003 | Iwata et al. |
| 2003/0111961 A1 | 6/2003 | Katz et al. |
| 2003/0138562 A1 * | 7/2003 | Subramony et al. .... 427/255.28 |
| 2003/0140851 A1 | 7/2003 | Janakiraman et al. |
| 2003/0168006 A1 | 9/2003 | Williams |
| 2003/0201723 A1 | 10/2003 | Katz et al. |
| 2003/0203515 A1 * | 10/2003 | Lin et al. ....................... 438/8 |
| 2003/0207530 A1 | 11/2003 | Yu et al. |
| 2003/0209323 A1 | 11/2003 | Yokogaki |
| 2004/0003873 A1 | 1/2004 | Chen et al. |
| 2004/0018699 A1 | 1/2004 | Boyd et al. |

| | | | |
|---|---|---|---|
| 2004/0060514 | A1 | 4/2004 | Janakiraman et al. |
| 2004/0083964 | A1 | 5/2004 | Ingle et al. |
| 2004/0161903 | A1 | 8/2004 | Yuan et al. |
| 2004/0200499 | A1 | 10/2004 | Harvey et al. |
| 2004/0216844 | A1 | 11/2004 | Janakiraman et al. |
| 2004/0224537 | A1 | 11/2004 | Lee et al. |
| 2005/0064730 | A1 | 3/2005 | Ingle et al. |
| 2005/0186755 | A1 | 8/2005 | Smythe et al. |
| 2005/0271812 | A1 | 12/2005 | Myo et al. |
| 2006/0030165 | A1 | 2/2006 | Ingle et al. |
| 2006/0046427 | A1 | 3/2006 | Ingle et al. |
| 2006/0148273 | A1 | 7/2006 | Ingle et al. |

FOREIGN PATENT DOCUMENTS

| | | | |
|---|---|---|---|
| EP | 0 520 519 | A1 | 12/1992 |
| EP | 0 959 496 | * | 11/1999 |
| JP | 01283375 | A | 11/1989 |
| JP | 01294868 | A | 11/1989 |
| JP | 4154116 | A | 5/1992 |
| JP | 11176593 | A | 7/1999 |
| TW | 479315 | | 3/2002 |
| TW | 479315 | B | 3/2002 |
| WO | WO 9925895 | A1 | 5/1999 |
| WO | WO 00/77831 | A2 | 12/2000 |
| WO | WO 2005/071740 | A | 8/2005 |
| WO | WO 2005/117087 | A | 12/2005 |

OTHER PUBLICATIONS

Baker, F. et al. "STI TEOS Densification for Furnaces and RTP Tools" 1999 IEEE/Semi Advanced Semiconductor Manufacturing Conference, 1999, pp. 394-399.

Definitions of "furnace", Merriam-Webster Online, 2006.

Fujino, K. et al., "Dependence of Deposition Characteristics on Base Materials in TEOS and Ozone CVD At Atmospheric Pressure," J. Electrochem. Soc., vol. 138, No. 2, pp. 550-554, Feb. 1991.

Kwok, K. et al., "Surface Related Phenomena in Integrated PECVD/Ozone-TEOS SACVD Processes for Sub-Half Micron Gap Fill: Electrostatic Effects," J. Electrochem. Soc., vol. 141, No. 8, pp. 2172-2177, Aug. 1994.

Kuo, Yue, "Etch Mechanism In The Low Refractive Index Silicon Nitride Plasma-Enhanced Chemical Vapor Deposition Process," Appl. Phys. Lett., vol. 63, No. 2, pp. 144-146, Jul. 12, 1993.

Lassig, Stephan E. et al., "Intermetal Dielectric Deposition By Electron Cyclotron Resonance Chemical Vapor Deposition (ECR CVD)," pp. cover and 1-21, no date.

Li, Junling et al., "Modeling Studies Of The Mechanisms In Biased ECR CVD," 3 pages, no date.

Machida, Katsuyuki et al., "SiO2 Planarization Technology With Biasing And Electron Cyclotron Resonance Plasma Deposition For Submicron Interconnections," J Vac. Sci. Technol. B, vol. 4, No. 4, pp. 818-821, Jul./Aug. 1986.

Romanelli, Alex, Semiconductor International website article: AMD Details 45nm Technology, at www.e-insite.net/semiconductor/; Jun. 12, 2003.

* cited by examiner

NITROUS OXIDE ANNEAL OF TEOS/OZONE CVD FOR IMPROVED GAPFILL

CROSS-REFERENCES TO RELATED APPLICATIONS

This application is a continuation of, and claims the benefit of, co-pending, commonly assigned U.S. patent application Ser. No. 10/757,771, filed on Jan. 14, 2004, which is a continuation-in-part of and claims the benefit of co-pending, commonly assigned U.S. patent application Ser. No. 10/247,672, entitled, "METHOD USING TEOS RAMP-UP DURING TEOS/OZONE CVD FOR IMPROVED GAP FILL," filed on Sep. 19, 2002, by Nitin K. Ingle, et al., the entire disclosure of each of which are herein incorporated by reference for all purposes.

BACKGROUND OF THE INVENTION

The fabrication sequence of integrated circuits often includes several patterning processes. The patterning processes may define a layer of conductors, such as a patterned metal or polysilicon layer, or may define isolation structures, such as trenches. In many cases the trenches are filled with an insulating, or dielectric, material. This insulating material can serve several functions. For example, in some applications the material serves to both electrically isolate one region of the IC from another, and electrically passivate the surface of the trench. The material also typically provides a base for the next layer of the semiconductor to be built upon.

After patterning a substrate, the patterned material is not flat. The topology of the pattern can interfere with or degrade subsequent wafer processing. It is often desirable to create a flat surface over the patterned material. Several methods have been developed to create such a flat, or "planarized", surface. Examples include depositing a conformal layer of material of sufficient thickness and polishing the wafer to obtain a flat surface, depositing a conformal layer of material of sufficient thickness and etching the layer back to form a planarized surface, and forming a layer of relatively low-melting point material, such as doped silicon oxide, and then heating the wafer sufficiently to cause the doped silicon oxide to melt and flow as a liquid, resulting in a flat surface upon cooling. Each process has attributes that make that process desirable for a specific application.

As semiconductor design has advanced, the feature size of the semiconductor devices has dramatically decreased. Many circuits now have features, such as traces or trenches, less than a micron across. While the reduction in feature size has allowed higher device density, more chips per wafer, more complex circuits, lower operating power consumption and lower cost among other benefits, the smaller geometries have also given rise to new problems, or have resurrected problems that were once solved for larger geometries.

An example of the type of manufacturing challenge presented by sub-micron devices is the ability to completely fill a narrow trench in a void-free manner. To fill a trench with silicon oxide, a layer of silicon oxide is first deposited on the patterned substrate. The silicon oxide layer typically covers the field, as well as walls and bottom of the trench. If the trench is wide and shallow, it is relatively easy to completely fill the trench. As the trench gets narrower and the aspect ratio (the ratio of the trench height to the trench width) increases, it becomes more likely that the opening of the trench will "pinch off".

Pinching off a trench may trap a void within the trench. Under certain conditions, the void will be filled during a reflow process, for example where the deposited silicon oxide is doped and experiences viscous flow at elevated temperatures. However, as the trench becomes narrower, it becomes more likely that the void will not be filled during the reflow process. Moreover, several types of applications call for the deposition of undoped silicon oxide (sometimes referred to a undoped silicate glass, "USG"), which is difficult to reflow even at elevated temperature. Voids resulting from pinching-off are undesirable as they can reduce the yield of good chips per wafer and the reliability of the devices.

One possible solution to this problem is a two-step process wherein a first deposition step is performed under process conditions with a low (silicon-containing gas):(oxidizing gas) ratio and low deposition rate for achieving the desired gap-fill. After this first step is performed, the flow of silicon-containing process gas to the chamber is interrupted, and then a second distinct deposition step is performed under different conditions with a high (silicon-containing gas):(oxidizing gas) ratio and a high deposition rate for bulk fill. However, such a two-step process may exhibit reduced throughput due to the extended time required in the first step, and also the time consumed in halting the process gas flow and changing the apparatus configuration between the first and second steps.

Therefore, it is desirable to be able to fill narrow gaps with dielectric material in a void-free manner. It is also desirable that the process used to deposit the dielectric material be efficient, reliable, and result in high yield of devices.

BRIEF SUMMARY OF THE INVENTION

Embodiments of the invention thus provide a method of filling a gap defined by adjacent raised features on a substrate. The method includes providing a flow of a silicon-containing processing gas to a chamber housing the substrate and providing a flow of an oxidizing gas to the chamber. The method also includes depositing a first portion of a film as a substantially conformal layer in the gap by causing a reaction between the silicon-containing processing gas and the oxidizing gas. Depositing the conformal layer includes varying over time a ratio of the (silicon-containing processing gas):(oxidizing gas) and regulating the chamber to a pressure in a range from about 200 torr to about 760 torr throughout deposition of the conformal layer. The method also includes depositing a second portion of the film as a bulk layer. Depositing a second portion of the film includes maintaining the ratio of the (silicon-containing processing gas):(oxidizing gas) substantially constant throughout deposition of the bulk layer and regulating the chamber to a pressure in a range from about 200 torr to about 760 torr throughout deposition of the bulk layer. The method also includes exposing the substrate to nitrous oxide at a temperature less than about 900° C. to anneal the deposited film. In some embodiments, exposing the substrate to nitrous oxide at a temperature less than about 900° C. to anneal the deposited film includes exposing the substrate to nitrous oxide at a temperature less than about 750° C. to anneal the deposited film.

In other embodiments a method of forming a silicon oxide layer on a substrate. The method includes providing a flow of a silicon-containing processing gas to a chamber housing the substrate and providing a flow of an oxidizing processing gas to the chamber. The method also includes causing a reaction between the silicon-containing processing gas and the oxidizing processing gas to form a silicon oxide layer. The method further includes heating the substrate in the presence of nitrous oxide. In some aspects, providing a flow of a silicon-containing processing gas comprises providing a flow of tetraethylorthosilicate (TEOS). In some aspects providing a flow of an oxidizing processing gas comprises providing a flow of ozone. Causing a reaction between the silicon-containing processing gas and the oxidizing processing gas may include regulating the pressure of the chamber to sub-atmospheric levels. The sub-atmospheric levels may include pressures in a range from about 200 torr to less than about 760 torr. Causing a reaction between the silicon-containing processing gas and the oxidizing processing gas may include regulating the temperature of the chamber to a range from about 400° C. to about 570° C. In some aspects heating the substrate in the presence of nitrous oxide may include heating the substrate to a temperature in a range from about 750° C. to about 1000° C. in a furnace. This also may include introducing steam into the furnace. Heating the substrate in the presence of nitrous oxide also may include heating the substrate to a temperature greater than or equal to 1000° C. in a rapid thermal process for a duration greater than or equal to 1 minute.

In other embodiments, a method of forming a silicon oxide layer on a substrate includes providing a flow of a silicon-containing processing gas to a chamber housing the substrate and providing a flow of ozone to the chamber. The method also includes causing a reaction between the silicon-containing processing gas and the ozone to form a silicon oxide layer. The method also includes heating the substrate in the presence of nitrous oxide in a furnace to a temperature in the range from about 750° C. to about 1000° C. The method may include introducing steam into the furnace. The silicon-containing processing gas may include tetraethylorthosilicate (TEOS).

In still other embodiments a method of forming a silicon oxide layer on a substrate, includes providing a flow of tetraethylorthosilicate (TEOS) processing gas to a chamber housing the substrate, providing a flow of ozone to the chamber, and regulating the pressure of the chamber to a pressure in a range from about 200 torr to less than about 760 torr. The method further includes causing a reaction between the TEOS and the ozone to form a silicon oxide layer. The method also includes heating the substrate in the presence of nitrous oxide. In some aspects heating the substrate in the presence of nitrous oxide includes heating the substrate in the presence of nitrous oxide in a furnace to a temperature in the range from about 750° C. to about 1000° C. In other aspects heating the substrate in the presence of nitrous oxide includes heating the substrate to a temperature greater than or equal to 1000° C. in a rapid thermal process for a duration greater than or equal to 1 minute.

In yet other embodiments a method of forming a silicon oxide layer on a substrate includes providing a flow of tetraethylorthosilicate (TEOS) processing gas to a chamber housing the substrate, providing a flow of ozone to the chamber, regulating the pressure of the chamber to a pressure in the range from about 200 torr to less than about 760 torr, and causing a reaction between the TEOS and the ozone to form a silicon oxide layer. The method also includes heating the substrate in the presence of nitrous oxide in a furnace to a temperature in the range from about 750° C. to about 1000° C.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components.

DETAILED DESCRIPTION OF THE INVENTION

Embodiments of the present invention provide methods, apparatuses, and devices related to chemical vapor deposition of silicon oxide. In one embodiment, a process is used to efficiently form a silicon oxide layer with good gap-filling properties. During a deposition phase of the process, silicon-containing gas and oxidizing processing gas are flowed, resulting in the formation of silicon oxide exhibiting a highly conformal character. During an annealing phase utilizing Nitrous Oxide ($N_2O$), potential weak seams or voids created during the deposition process are strengthened. Aspects of the present invention are best understood with reference to the limitations of conventional processes.

I. Introduction

Figure 1:
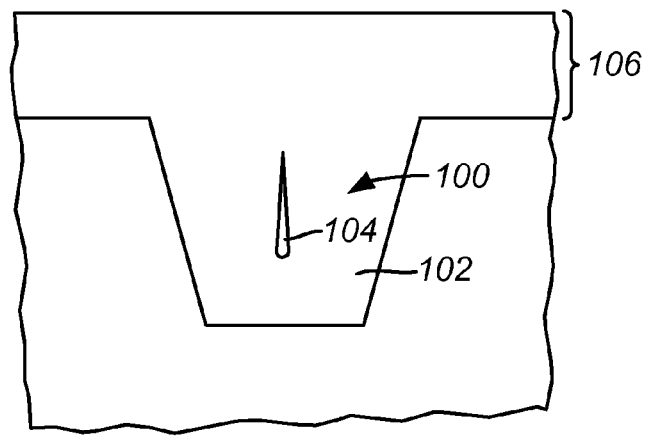
FIG. 1 shows a simplified cross-sectional view of a trench filled with oxide utilizing conventional deposition techniques.

FIG. 1 shows a simplified cross-sectional view of an example of trench 100 filled with silicon oxide 102 deposited utilizing a conventional process. FIG. 1 shows that the increased rate of deposition of oxide material on the raised edges of the trench 100 has resulted in pinching-off of the trench and created unwanted void or pinhole defect 104 within the feature. Void 104 can adversely affect the operation of a semiconductor device that is relying upon the consistent dielectric strength of the oxide-filled trench.

FIG. 1 also shows formation of bulk oxide layer 106 over oxide-filled trench 100. Bulk layer 106 provides additional dielectric material to serve as the starting point for continued processing, for example subsequent chemical-mechanical polishing. Although bulk layer 106 overlies the oxide-filled trench and is substantially planar, subsequent processing may expose the void 104.

Figure 2A:
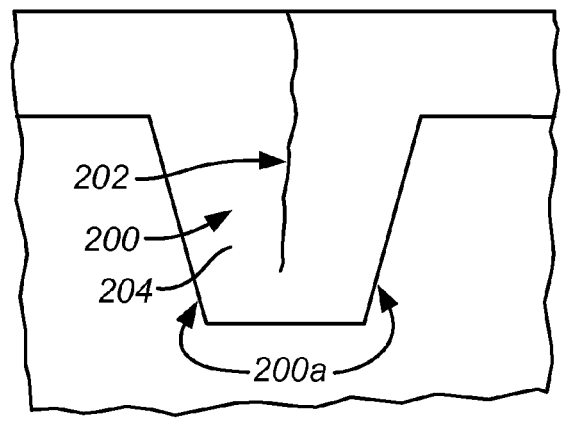
FIG. 2A shows a simplified cross-sectional view of a second trench filled with oxide utilizing conventional deposition techniques.

FIG. 2A shows a simplified cross-sectional view of another example of a trench 200 filled with silicon oxide deposited utilizing a conventional process. FIG. 2A shows that while pinch-off and void formation has not occurred, weak seam 202 is formed where silicon oxide material 204, grown outward from opposed sidewalls 200a of trench 200, meets.

Figure 2B:
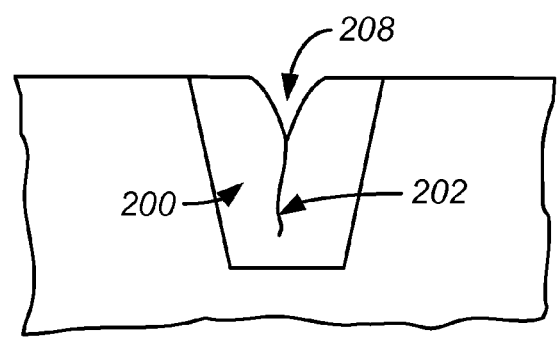
FIG. 2B shows a simplified cross-sectional view of the conventional oxide-filled trench of FIG. 2A after a chemical mechanical polishing.

The relatively poor quality of seam 202 results in oxide along this seam being removed at faster rates relative to the surrounding oxide material when the oxide layer is exposed to an etchant such as hydrofluoric acid (HF). FIG. 2B shows a simplified cross-sectional view of the oxide-filled trench 200 of FIG. 2A after exposure to chemical mechanical polishing (CMP) and post-CMP cleaning utilizing HF etchant. FIG. 2B illustrates that the enhanced rate of etching along seam 202 has resulted in unwanted dishing 208 in the surface of the oxide-filled trench 200. Such dishing 208 can adversely affect operation of a semiconductor device relying upon the consistent dielectric strength of the oxide-filled trench feature.

Figure 3:
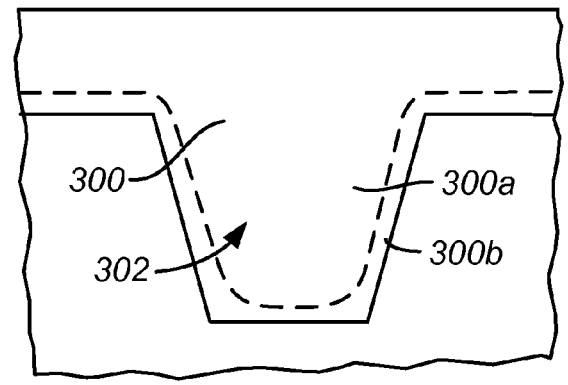
FIG. 3 shows a simplified cross-sectional view of an oxide-filled trench in accordance with an embodiment of the present invention.

FIGS. 1 and 2A-B are to be contrasted with FIG. 3, which shows a simplified cross-sectional view of an oxide-filled trench structure formed utilizing an embodiment of a process in accordance with the present invention. Specifically, a silicon-containing gas such as TEOS and an oxidizing processing gas such as ozone are flowed during a deposition process, followed by thermal annealing using $N_2O$. This process results in formation of an oxide film 300 that includes a highly conformal initial layer 300b proximate to the surrounding silicon sidewalls, and a less-conformal bulk layer 300a which fills the remaining volume of the trench 302. More importantly, however, the oxide-filled trench 302 of FIG. 3 does not include the voids or weak seams associated with similar features formed utilizing the conventional oxide CVD processes previously described.

II. An Exemplary Oxide Deposition Process

Figure 4:
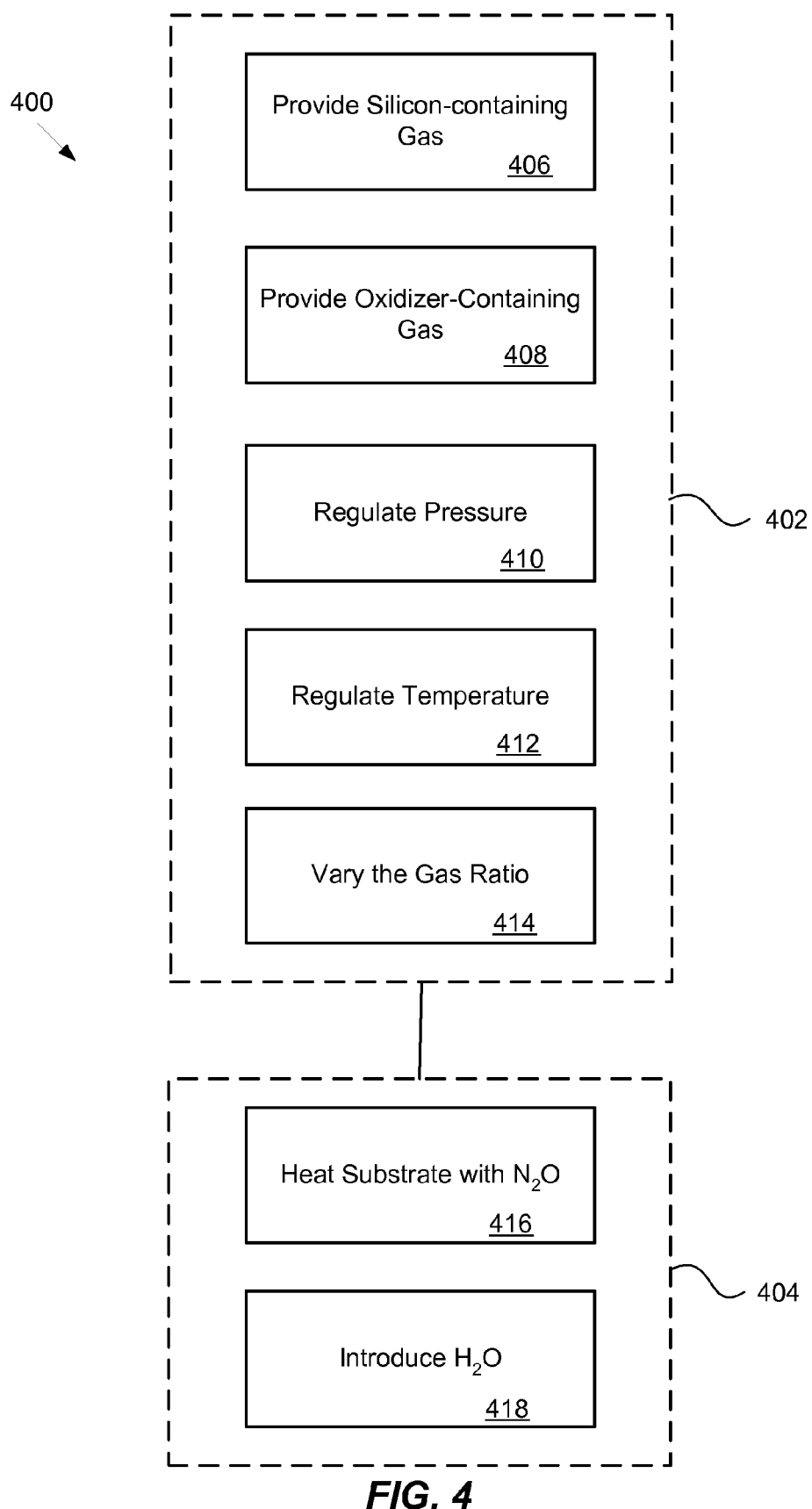
FIG. 4 illustrates a method according to an embodiment of the invention.

FIG. 4 illustrates a exemplary method 400 according to embodiments of the invention. At block 402, an oxide layer is deposited on a substrate in a CVD process, and at block 404 the oxide layer is annealed. The deposition may take place in a CVD chamber, which is described in detail hereinafter. The deposition includes flowing a silicon-containing process gas into a chamber that houses the substrate at block 406 and flowing an oxidizing processing gas into the chamber at block 408. In a specific embodiment, the silicon-containing gas comprises tetraethylorthosilicate (TEOS); however, other silicon-containing processing gases such as $SiH_4$, $S_2H_6$, $S_3H_8$, etc., may be used. Also in a specific embodiment, the oxidizing processing gas comprises ozone ($O_3$), although oxidizing gases such as $O_2$, $H_2O$, $H_2O_2$ may alternatively be used. Furthermore, this embodiment of the invention is described for gapfill with an USG, but it will be appreciated that the film may be doped in alternative embodiments. For example, dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like.

The chamber pressure during the deposition process of block 402 may be regulated as indicated by block 410. In some embodiments, the pressure is maintained at sub-atmospheric pressures. In a specific embodiment, the pressure during the deposition process may range from about 200 torr to less than about 760 torr, although the pressure profile may remain within a much narrower range. Also during the deposition process, the temperature may be regulated as indicated by block 412. In some embodiments the temperature is varied from about 400° C. to about 570° C., although the temperature may be maintained within a much narrower range. Regulating the temperature and pressure of the chamber regulates a reaction between the silicon-containing process gas and the oxidizer-containing process gas.

Oxide layer deposition 402 may be performed according to the process described in more detail in previously-incorporated U.S. patent application Ser. No. 10/247,672. The process includes varying the ratio (silicon-containing gas):(oxidizer-containing gas) 414, thereby varying the rate at which the oxide layer is deposited and possibly the composition of the conformal layer. For example, at the start of the process the concentration of the silicon-containing gas in the mixture may be small, then may be increased as the film thickness increases. In such examples, oxide layer deposition 402 may comprise depositing a conformal initial layer 300b during a phase in which the silicon-containing gas concentration in the mixture is small, then depositing a bulk layer 300a during a phase in which the silicon-containing gas concentration in the mixture is higher.

Oxide layer deposition 402 may comprise an SACVD process. With high aspect ratio narrow gaps, greater success is achieved by varying the ratio (silicon-containing process gas):(oxidizing gas), beginning with a lower concentration of silicon-containing process gas, as described above, for gapfill. The process may be further aided by disbursing the gas uniformly across the substrate. As the concentration of silicon-containing process gas in the mixture increases, the gas may be disbursed closer to the surface of the substrate. This technique and an apparatus for practicing it are more fully described in co-pending, commonly assigned U.S. patent application Ser. No. 10/057,280, filed on Jan. 25, 2002, entitled "GAS DISTRIBUTION SHOWERHEAD," and/or co-pending, commonly assigned U.S. patent application Ser. No. 10/674,569, filed on Sep. 29, 2003, entitled "GAS DISTRIBUTION SHOWERHEAD," the entire disclosure of each of which are herein incorporated by reference.

Following the deposition process, the oxide layer is annealed at block 404. The annealing process includes heating the substrate and flowing $N_2O$ into the chamber or furnace. This is shown as block 416. The $N_2O$ interacts with the $SiO_2$ network at high temperatures and strengthens any weak seams formed during the deposition process. The resulting $SiO_2$ layer is seam-free and suited for CMP.

Annealing may take may take place in situ or ex situ. For example, if oxide layer deposition 402 takes place in a CVD chamber, annealing 404 may take place in the same chamber immediately thereafter. Annealing 404 alternatively may take place in another chamber of a multi-chamber system or in a different chamber system (e.g., a furnace). In some embodiments, annealing comprises a Rapid Thermal Process (RTP) as more fully described in U.S. Pat. No. 5,660,472, the entire disclosure of which is herein incorporated by reference for all purposes. The annealing process may be wet (e.g., using steam), as indicated by block 418, or dry.

The annealing temperature may range from about 750° C. to about 1000° C. for furnace anneal and up to about 1200° C. for RTP anneal. The annealing duration is temperature dependent and may range from about 10 minutes to around 2 hours for furnace anneal and as few as 5 seconds up to around 3 minutes for RTP. As a result, in most cases, the layer is annealed by restructuring the $SiO_2$ network without exceeding the USG reflow temperature.

During the $N_2O$ anneal process, a thin layer of silicon nitride and/or silicon oxynitride may be formed in the $SiO_2$/Si interface. This layer may prevent further oxidation into the Si in which the trench is formed. This is particularly useful for wet anneal processes since the water vapor may otherwise penetrate into the Si layer, leading to excessive oxidation. Another advantage to the $N_2O$ anneal process is that is provides integrity of the top corners of STI trenches.

Alternative embodiments of the previously-described processes may include more or fewer operations. Further, the operations in alternative embodiments are not necessarily performed in the order depicted, as is apparent to those skilled in the art in light of the disclosure herein.

III. An Exemplary Deposition System

Figure 5A:
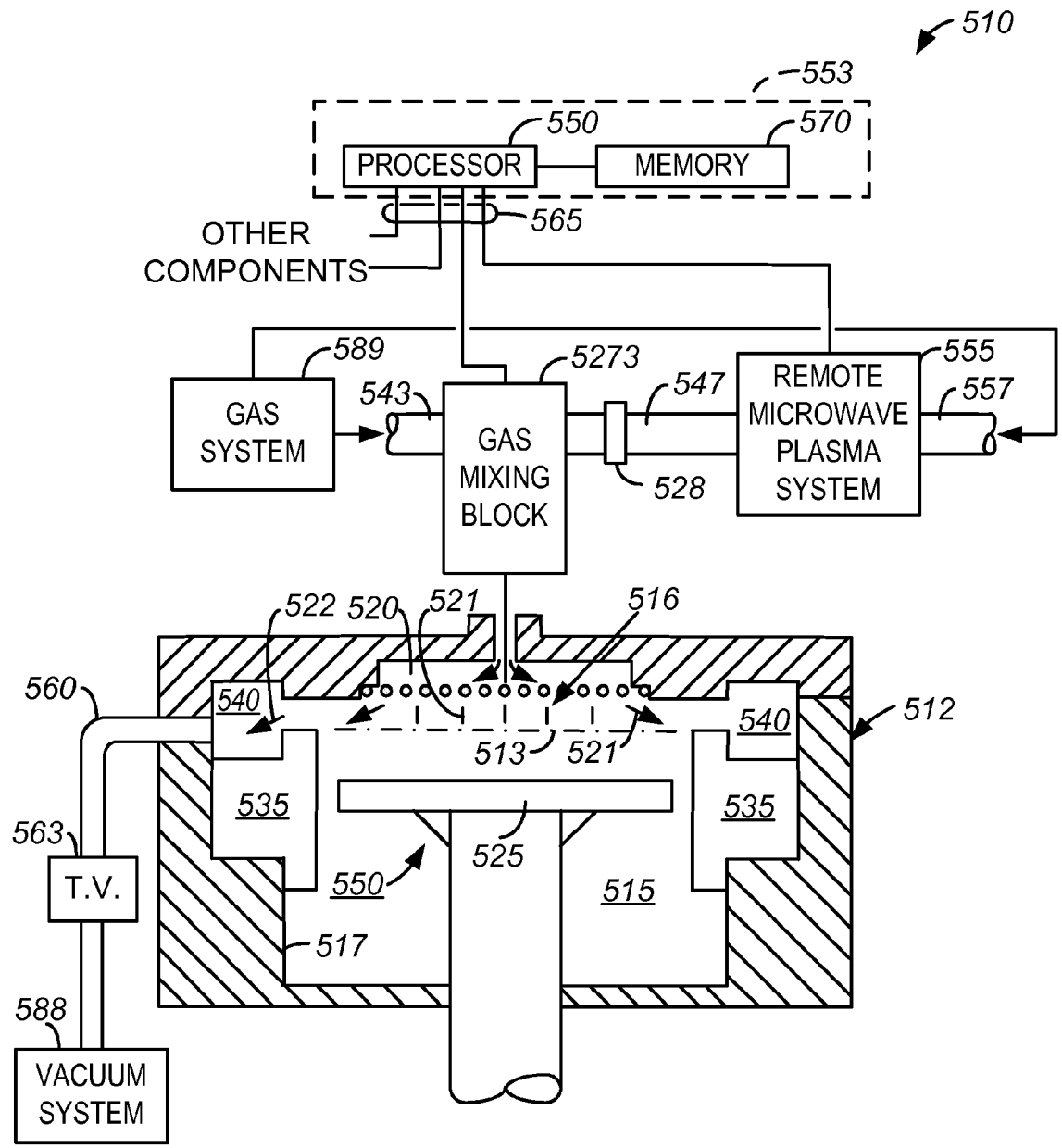
FIG. 5A is a simplified representation of a CVD apparatus according to embodiments of the present invention.

Having described methods according to embodiments of the present invention, attention is directed to FIG. 5A, which illustrates a simplified diagram of a CVD system 510 according to an embodiment of the present invention. This system is suitable for performing thermal, SACVD processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 515 that receives process and other gases from a gas delivery system 589, a vacuum system 588, a remote microwave plasma system 555, and a control system 553. These and other components are described below in order to understand the present invention.

The CVD apparatus 510 includes an enclosure assembly 512 housing a vacuum chamber 515 with a gas reaction area 516. A gas distribution plate 520 is provided above the gas reaction area 516 for dispersing reactive gases and other gases, such as purge gases, through perforated holes in the gas distribution plate 520 to a wafer (not shown) that rests on a vertically movable heater 525 (also referred to as a wafer support pedestal). The heater 525 can be controllably moved between a lower position, where a wafer can be loaded or unloaded, for example, and a processing position closely adjacent to the gas distribution plate 520, indicated by a dashed line 513, or to other positions for other purposes, such as for an etch or cleaning process. A center board (not shown) includes sensors for providing information on the position of the wafer.

In some embodiments, the gas distribution plate 520 may be of the variety described in either of previously-incorporated U.S. patent application Ser. Nos. 10/057,280 or 10/674,569. These plates improve the uniformity of gas disbursement at the substrate and are particularly advantageous in deposition processes that vary gas concentration ratios. In some examples, the plates work in combination with the vertically moveable heater 525 (or moveable wafer support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

The heater 525 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 525 exposed to the vacuum chamber 515 are made of a ceramic material, such as aluminum oxide ($Al_2O_3$ or alumina) or aluminum nitride.

Reactive and carrier gases are supplied through the supply line 543 into a gas mixing box (also called a gas mixing block) 527, where they are preferably mixed together and delivered to the gas distribution plate 520. The gas mixing box 527 is preferably a dual input mixing block coupled to a process gas supply line 543 and to a cleaning/etch gas conduit 547. A valve 528 operates to admit or seal gas or plasma from the gas conduit 547 to the gas mixing block 527. The gas conduit 547 receives gases from an integral remote microwave plasma system 555, which has an inlet 557 for receiving input gases. During deposition processing, gas supplied to the plate 520 is vented toward the wafer surface (as indicated by arrows 521), where it may be uniformly distributed radially across the wafer surface, typically in a laminar flow.

Purging gas may be delivered into the vacuum chamber 515 from the plate 520 and/or an inlet port or tube (not shown) through the bottom wall of enclosure assembly 512. The purging gas flows upward from the inlet port past the heater 525 and to an annular pumping channel 540. An exhaust system then exhausts the gas (as indicated by arrows 522) into the annular pumping channel 540 and through an exhaust line 560 to a vacuum system 588, which includes a vacuum pump (not shown). Exhaust gases and entrained particles are drawn from the annular pumping channel 540 through the exhaust line 560 at a rate controlled by a throttle valve system 563.

The remote microwave plasma system 555 can produce a plasma for selected applications, such as chamber cleaning or etching native oxide or residue from a process wafer. Plasma species produced in the remote plasma system 555 from precursors supplied via the input line 557 are sent via the conduit 547 for dispersion through the plate 520 to the vacuum chamber 515. Precursor gases for a cleaning application may include fluorine, chlorine, and other reactive elements. The remote microwave plasma system 555 also may be adapted to deposit plasma-enhanced CVD films by selecting appropriate deposition precursor gases for use in the remote microwave plasma system 555.

The system controller 553 controls activities and operating parameters of the deposition system. The processor 550 executes system control software, such as a computer program stored in a memory 570 coupled to the processor 550. Preferably, the memory 570 may be a hard disk drive, but of course the memory 570 may be other kinds of memory, such as read-only memory or flash memory. In addition to a hard disk drive (e.g., memory 570), the CVD apparatus 510 in a preferred embodiment includes a floppy disk drive and a card rack (not shown).

The processor 550 operates according to system control software programmed to operate the device according to the methods disclosed herein. For example, sets of instructions may dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 550 to configure the CVD system 510 into various apparatus.

The processor 550 has a card rack (not shown) that contains a single-board computer, analog and digital input/output boards, interface boards and stepper motor controller boards. Various parts of the CVD system 510 conform to the Versa Modular European (VME) standard which defines board, card cage, and connector dimensions and types. The VME standard also defines the bus structure having a 16-bit data bus and 24-bit address bus.

Figure 5B:
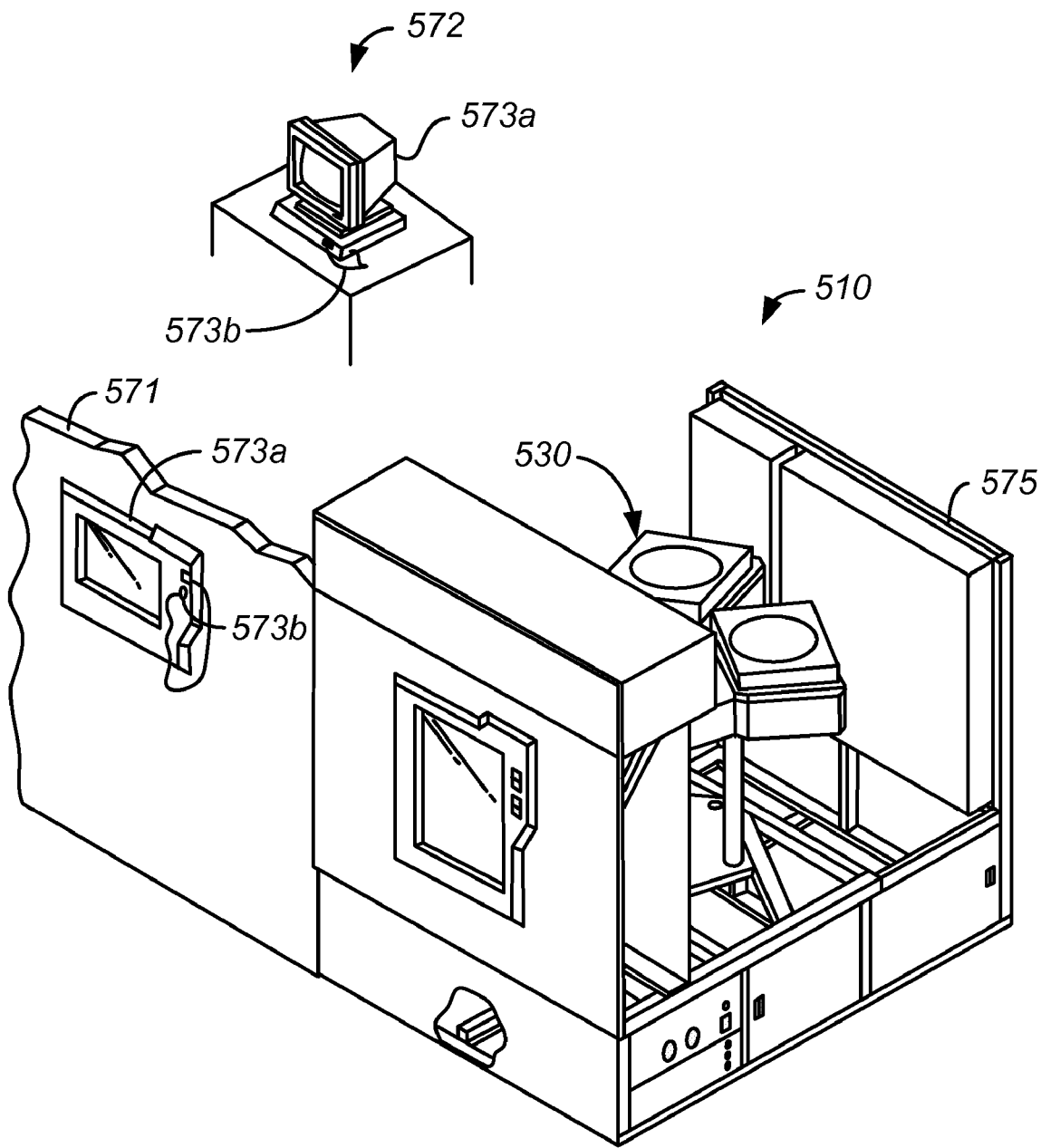
FIG. 5B is a simplified representation of the user interface for a CVD system in relation to a deposition chamber in a multi-chamber system.

FIG. 5B is a simplified diagram of a user interface in relation to the CVD apparatus chamber 530. The CVD apparatus 510 includes one chamber of a multichamber system. Wafers may be transferred from one chamber to another for additional processing. In some cases the wafers are transferred under vacuum or a selected gas. The interface between a user and the processor is via a CRT monitor 573*a* and a light pen 573*b*. A mainframe unit 575 provides electrical, plumbing, and other support functions for the CVD apparatus 510. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In some embodiments two monitors 573a are used, one mounted in the clean room wall 571 for the operators, and the other behind the wall 572 for the service technicians. Both monitors 573a simultaneously display the same information, but only one light pen 573b is enabled. The light pen 573b detects light emitted by the CRT display with a light sensor in the tip of the pen. To select a particular screen or function, the operator touches a designated area of the display screen and pushes the button on the pen 573b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 573b to allow the user to communicate with the processor.

Figure 5C:
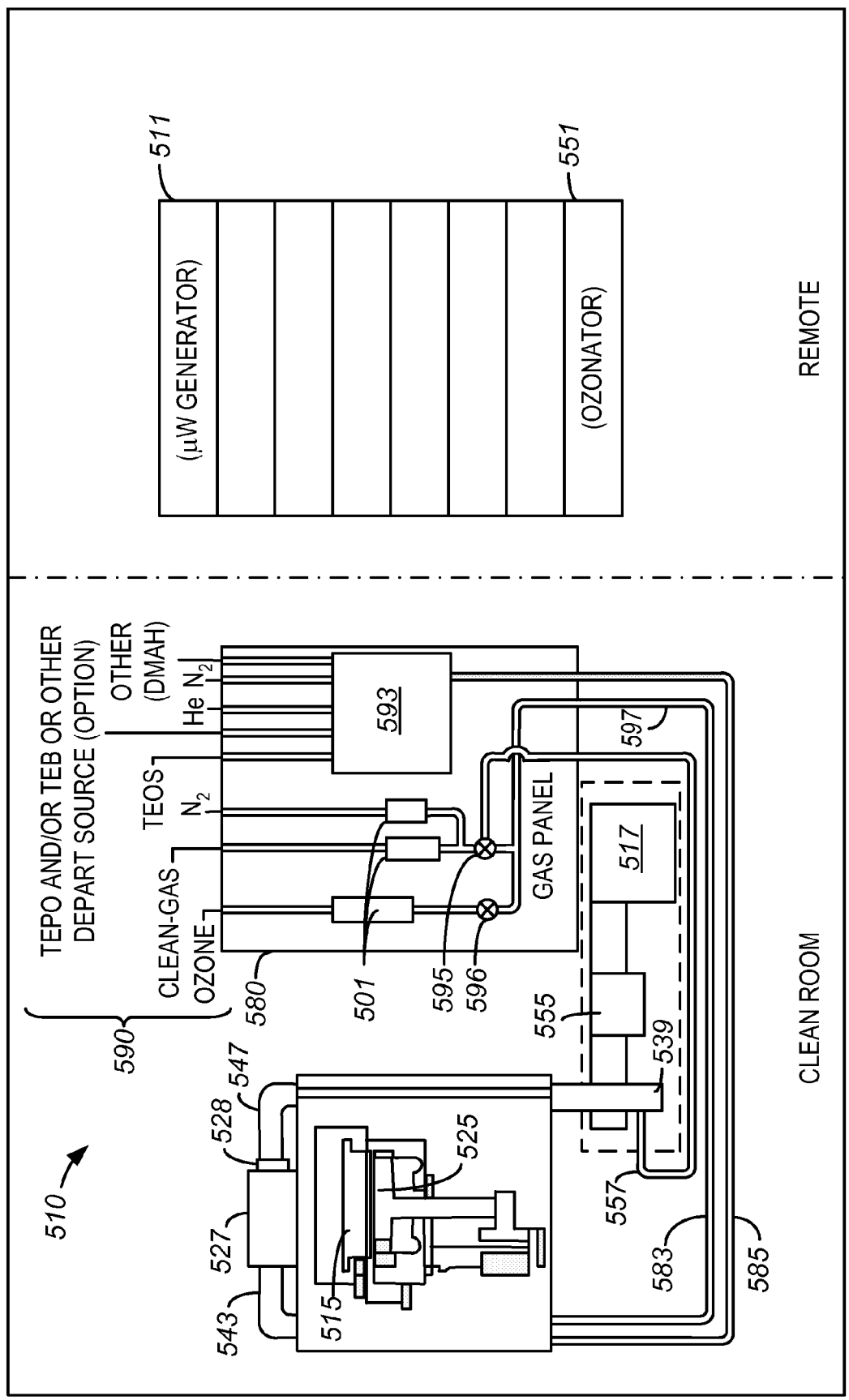
FIG. 5C is a simplified diagram of a gas panel and supply lines in relation to a deposition chamber.

FIG. 5C illustrates a general overview of an embodiment of the CVD apparatus 510 in relation to a gas supply panel 580 located in a clean room. As discussed above, the CVD system 510 includes a chamber 515 with a heater 525, a gas mixing box 527 with inputs from an inlet tube 543 and a conduit 547, and remote microwave plasma system 555 with input line 557. As mentioned above, the gas mixing box 527 is for mixing and injecting deposition gas(es) and clean gas(es) or other gas(es) through the inlet tube 543 to the processing chamber 515.

The remote microwave plasma system 555 is integrally located and mounted below the chamber 515 with the conduit 547 coming up alongside the chamber 515 to the gate valve 528 and the gas mixing box 527, located above the chamber 515. Microwave generator 511 and ozonator 551 are located remote from the clean room. Supply lines 583 and 585 from the gas supply panel 580 provide reactive gases to the gas supply line 543. The gas supply panel 580 includes lines from gas or liquid sources 590 that provide the process gases for the selected application. The gas supply panel 580 has a mixing system 593 that mixes selected gases before flow to the gas mixing box 527. In some embodiments, gas mixing system 593 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 595 that can be used to automatically or manually shut off the flow of process gas into line 585 or line 557, and (ii) liquid flow meters (LFM) 501 or other types of controllers that measure the flow of gas or liquid through the supply lines.

As an example, a mixture including TEOS as a silicon source may be used with gas mixing system 593 in a deposition process for forming a silicon oxide film. The TEPO is a liquid source that may be vaporized by conventional boiler-type or bubbler-type hot boxes. However, a liquid injection system is preferred as it provides greater control of the volume of reactant liquid introduced into the gas mixing system. The liquid is typically injected as a fine spray or mist into the carrier gas flow before being delivered to a heated gas delivery line 585 to the gas mixing block and chamber. One or more sources, such as oxygen ($O_2$) or ozone ($O_3$) flow to the chamber through another gas delivery line 583, to be combined with the reactant gases from heated gas delivery line 585 near or in the chamber. Of course, it is recognized that other sources of dopants, silicon, and oxygen also may be used.

IV. Exemplary Semiconductor Structure

Figure 6:
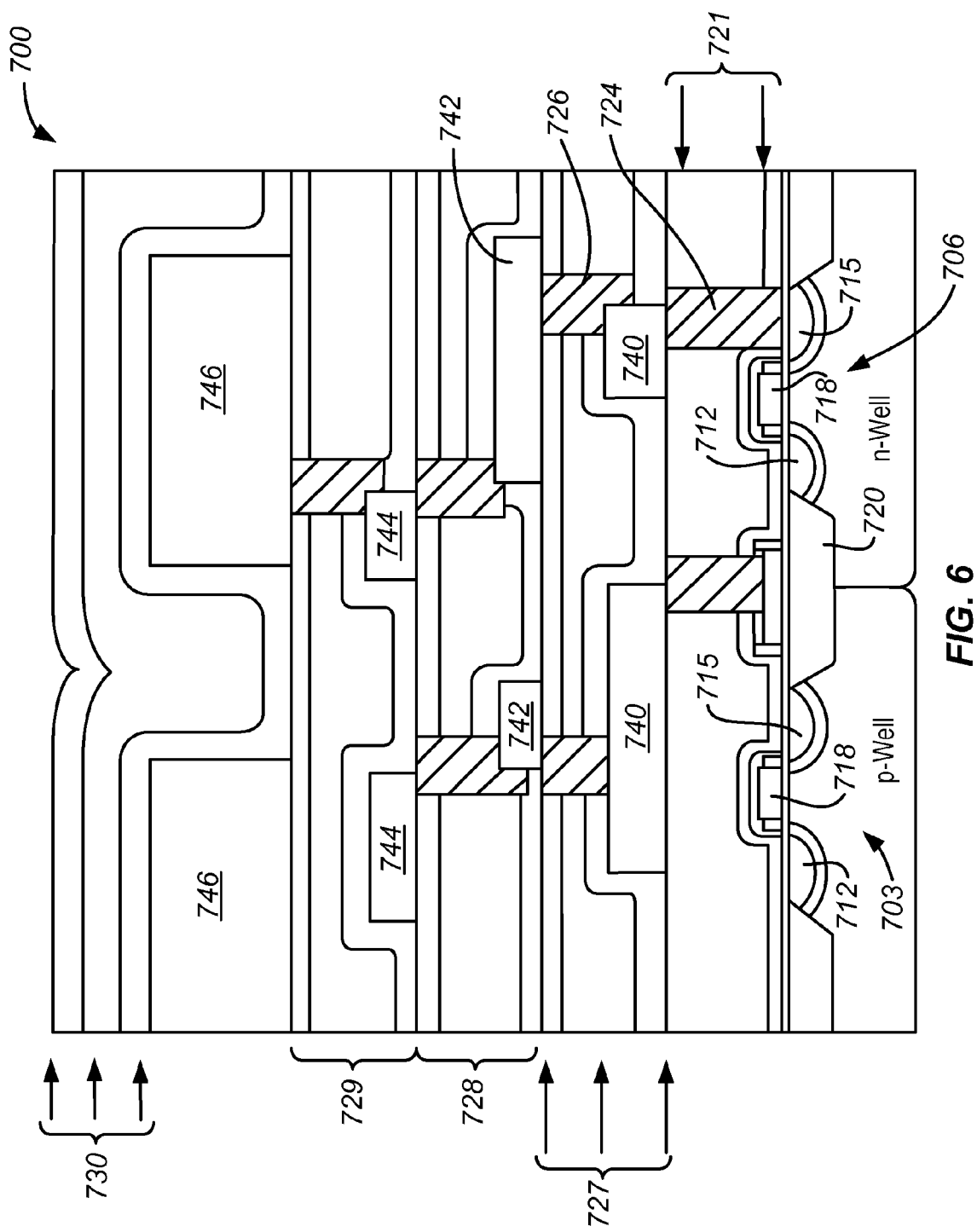
FIG. 6 is a simplified cross section of a portion of an integrated circuit according to embodiments of the present invention.

FIG. 6 illustrates a simplified cross-sectional view of an integrated circuit 700 according to an embodiment of the present invention. As shown in FIG. 7, the integrated circuit 700 includes NMOS and PMOS transistors 703 and 706, which are separated and electrically isolated from each other by oxide-filled trench isolation structure 720. Alternatively, field oxide isolation can be used to isolate devices, or a combination of isolation techniques may be used. Each of the transistors 703 and 706 comprises a source region 712, a gate region 715, and a drain region 718.

A premetal dielectric (PMD) layer 721 separates the transistors 703 and 706 from the metal layer 740, with connections between metal layer 740 and the transistors made by contacts 724. The premetal dielectric layer 721 may comprise a single layer or multiple layers. The metal layer 740 is one of four metal layers, 740, 742, 744, and 746, included in the integrated circuit 700. Each metal layer is separated from adjacent metal layers by intermetal dielectric layers 727, 728, and 729. Adjacent metal layers are connected at selected openings by vias 726. Planarized passivation layers 730 are deposited over the metal layer 746.

A silicon oxide layer deposited according to an embodiment of the present invention may be used to form one or more of the dielectric layers shown in integrated circuit 700. For example, a silicon oxide layer may be used to create trench isolation structure 720. A silicon oxide layer deposited according to the present invention may also be used to create PMD layer 721, or the higher layer intermetal dielectric layers 727-729 of the overlying interconnect structure.

A silicon oxide layer deposited according to an embodiment of the present invention may also be used in damascene layers, which are included in some integrated circuits. In damascene layers, a blanket layer is deposited over a substrate, selectively etched through to the substrate, and then filled with metal and etched back or polished to form metal contacts 724. After the metal layer is deposited, a second blanket deposition is performed and selectively etched. The etched areas are then filled with metal and etched back or polished to form vias 726.

It should be understood that the simplified integrated circuit 700 is for illustrative purposes only. One of ordinary skill in the art could implement the present method for fabrication of other integrated circuits, such as microprocessors, application-specific integrated circuits (ASICs), memory devices, and the like.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention, which is defined in the following claims.

What is claimed is:

1. A method of forming a silicon oxide layer on a substrate, comprising:
   providing a flow of tetraethylorthosilicate (TEOS) to a chamber housing the substrate;
   providing a flow of ozone to the chamber;
   causing a reaction between the tetraethylorthosilicate and the ozone to form a silicon oxide layer by, at least in part, varying over time a ratio of the (tetraethylorthosilicate): (ozone); and
   after causing the reaction heating the substrate in the presence of nitrous oxide,
      wherein the heating of the substrate in the presence of the nitrous oxide comprises heating the substrate to a temperature in a range from about 750° C. to about 1000° C. in a furnace while introducing steam into the furnace.

2. A method of forming a silicon oxide layer on a substrate, comprising:
providing a flow of a tetraethylorthosilicate (TEOS) to a chamber housing the substrate;
providing a flow of ozone to the chamber;
causing a reaction between the tetraethylorthosilicate (TEOS) and the ozone to form a silicon oxide layer by, at least in part, varying over time a ratio of the (tetraethylorthosilicate):(ozone); and
heating the substrate in the presence of nitrous oxide in a furnace to a temperature in the range from about 750° C. to about 1000° C., wherein steam is introduced into the furnace.

3. A method of forming isolation structures in a silicon substrate, comprising:
etching trenches in the substrate;
providing a flow of a silicon-containing processing gas to a chamber housing the substrate;
providing a flow of an oxidizing gas to the chamber;
causing a reaction between the silicon-containing processing gas and the oxidizing gas to form a silicon oxide layer by, at least in part, varying over time a ratio of the (silicon-containing processing gas):(oxidizing gas);
heating the substrate in the presence of nitrous oxide; and
thereafter, planarizing the layer,
wherein causing the reaction between the silicon-containing processing gas and the oxidizing gas to form the silicon oxide layer comprises:
depositing a first portion of the silicon oxide layer as a substantially conformal layer in the trenches by causing the reaction between the silicon-containing processing gas and the oxidizing gas, wherein depositing the substantially conformal layer comprises varying over time the ratio of the (silicon-containing processing gas):(oxidizing gas) and regulating the chamber to a pressure in a range from about 200 torr to about 760 torr throughout deposition of the substantially conformal layer; and
thereafter, depositing a second portion of the silicon oxide layer as a bulk layer, wherein depositing the second portion of the silicon oxide layer comprises maintaining the ratio of the (silicon-containing processing gas): (oxidizing gas) substantially constant throughout deposition of the bulk layer and regulating the chamber to a pressure in a range from about 200 torr to about 760 torr throughout deposition of the bulk layer.

4. The method of claim 3, wherein planarizing the layer comprises subjecting the layer to chemical mechanical polishing.

5. The method of claim 3, wherein heating the substrate in the presence of nitrous oxide comprises exposing the substrate to nitrous oxide at a temperature less than about 900° C. to anneal the silicon oxide layer.

* * * * *